(12) United States Patent
Yang et al.

(10) Patent No.: US 12,342,579 B2
(45) Date of Patent: Jun. 24, 2025

(54) SEMICONDUCTOR DEVICE

(71) Applicant: UNITED MICROELECTRONICS CORP., Hsin-Chu (TW)

(72) Inventors: Po-Yu Yang, Hsinchu (TW); Fang-Yun Liu, Hsinchu (TW); Chien-Tung Yue, Taipei (TW); Kuo-Liang Yeh, Hsinchu (TW); Mu-Kai Tsai, Hsinchu County (TW); Jinn-Horng Lai, Miaoli County (TW); Cheng-Hsiung Chen, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 525 days.

(21) Appl. No.: 17/700,530

(22) Filed: Mar. 22, 2022

(65) Prior Publication Data
US 2023/0268440 A1 Aug. 24, 2023

(30) Foreign Application Priority Data
Feb. 18, 2022 (CN) .......................... 202210149392.2

(51) Int. Cl.
*H10D 30/69* (2025.01)
*H01L 23/58* (2006.01)
*H10D 84/85* (2025.01)

(52) U.S. Cl.
CPC ......... *H10D 30/794* (2025.01); *H01L 23/585* (2013.01); *H10D 84/85* (2025.01)

(58) Field of Classification Search
CPC ........................... H01L 29/7845; H10D 30/794
See application file for complete search history.

(56) References Cited

U.S. PATENT DOCUMENTS

| | | | | |
|---|---|---|---|---|
| 2004/0046185 A1* | 3/2004 | Sashida | ............. | H01L 21/02266 257/E21.279 |
| 2004/0253776 A1* | 12/2004 | Hoffmann | ........... | H01L 29/7845 257/E21.198 |
| 2005/0116360 A1* | 6/2005 | Huang | ................ | H01L 29/7845 257/900 |
| 2008/0061285 A1* | 3/2008 | Arghavani | .......... | H01L 29/7845 438/285 |
| 2008/0096338 A1* | 4/2008 | Zhang | ................. | H01L 29/7843 257/E21.633 |
| 2013/0075872 A1* | 3/2013 | Chuang | ................... | H01L 24/06 257/632 |

OTHER PUBLICATIONS

Thompson, "A Logic Nanotechnology Featuring Strained-Silicon", IEEE Electron Device Letters, vol. 25, No. 4, Apr. 2004.

* cited by examiner

*Primary Examiner* — Walter H Swanson
*Assistant Examiner* — Jacob T Nelson
(74) *Attorney, Agent, or Firm* — Winston Hsu

(57) ABSTRACT

A semiconductor device includes a substrate, a first transistor disposed on the substrate, a second transistor in proximity to the first transistor on the substrate, at least one interlayer dielectric layer covering the first transistor and the second transistor, a first stress-inducing dummy metal pattern disposed on the at least one interlayer dielectric layer and directly above the first transistor, and a second stress-inducing dummy metal pattern disposed on the at least one interlayer dielectric layer and directly above the second transistor.

14 Claims, 9 Drawing Sheets

SEMICONDUCTOR DEVICE

BACKGROUND OF THE INVENTION

1. Field of the Invention

The present disclosure generally relates to a semiconductor device, and more particularly, to a semiconductor device including a field effect transistor (FET) device and a stress-inducing metal pattern disposed directly over the FET device.

2. Description of the Prior Art

Channel straining techniques have been used in CMOS manufacturing to enhanced carrier mobility in the channel region. Based on the type of carrier and the direction of the stress applied, the carrier mobility within the channel region may be enhanced or reduced. For example, in a p-type FET (p-FET), applying a compressive stress to the channel region may increase hole mobility while reducing electron mobility, this in turn may improve the performance of p-FET devices. Similarly, in an n-type FET (n-FET), applying a tensile stress to the channel region may increase electron mobility while reducing hole mobility, this in turn may improve the performance of n-FET devices.

Epitaxial growth techniques have been developed and implemented into the process flow to form the germanium or carbon-containing stress layers at appropriate locations near the channel region. Hence, process complexity is significantly increased, thereby also increasing production costs and the potential for a reduction in production yield. There exists a need for an alternative technique that enables the creation of desired stress conditions in the transistor structure without requiring complex and expensive epitaxial growth techniques or variations of critical manufacturing steps.

SUMMARY OF THE INVENTION

It is one object of the present disclosure to provide an improved semiconductor device in order to solve the above-mentioned deficiencies or shortcomings of the prior art.

One aspect of the present disclosure provides a semiconductor device including a substrate, a first transistor disposed on the substrate, a second transistor disposed in proximity to the first transistor on the substrate, at least one interlayer dielectric layer covering the first transistor and the second transistor, a first stress-inducing dummy metal pattern disposed on the at least one interlayer dielectric layer and directly above the first transistor, and a second stress-inducing dummy metal pattern disposed on the at least one interlayer dielectric layer and directly above the second transistor.

According to some embodiments, the first stress-inducing dummy metal pattern and the second stress-inducing dummy metal pattern are disposed in a top metal layer.

According to some embodiments, the top metal layer is a copper damascene layer.

According to some embodiments, the first stress-inducing dummy metal pattern and the second stress-inducing dummy metal pattern are disposed in a pad layer.

According to some embodiments, the pad layer is an aluminum pad layer.

According to some embodiments, the first stress-inducing dummy metal pattern is an annular metal ring pattern and the second stress-inducing dummy metal pattern is a monolithic pad pattern.

According to some embodiments, the first stress-inducing dummy metal pattern and the second stress-inducing dummy metal pattern are monolithic pad patterns.

According to some embodiments, the first stress-inducing dummy metal pattern and the second stress-inducing dummy metal pattern are annular metal ring patterns.

According to some embodiments, the first stress-inducing dummy metal pattern and the second stress-inducing dummy metal pattern are covered with a passivation layer.

According to some embodiments, the passivation layer comprises a silicon oxide layer and a stressed silicon nitride layer.

According to some embodiments, the stressed silicon nitride layer is a compressive silicon nitride layer.

According to some embodiments, the first transistor is an NMOS transistor and the stressed silicon nitride layer has tensile stress over the first transistor, and wherein the second transistor is a PMOS transistor and the stressed silicon nitride layer has compressive stress over the second transistor.

According to some embodiments, the first transistor is an NMOS transistor and the stressed silicon nitride layer has compressive stress over the first transistor, and wherein the second transistor is a PMOS transistor and the stressed silicon nitride layer has tensile stress over the second transistor.

According to some embodiments, the first stress-inducing dummy metal pattern and the second stress-inducing dummy metal pattern are electrically floating.

According to some embodiments, the first stress-inducing dummy metal pattern and the second stress-inducing dummy metal pattern have a width greater than or equal to 2 micrometers along an extending direction of a gate underlying the first stress-inducing dummy metal pattern and the second stress-inducing dummy metal pattern.

According to some embodiments, the first stress-inducing dummy metal pattern and the second stress-inducing dummy metal pattern have a thickness greater than 0.8 micrometers.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

The present invention discloses a semiconductor device comprising a field effect transistor (FET) device and a stress-inducing dummy metal pattern disposed directly above the FET device, which is suitable for applications in, for example, inverter circuits, radio frequency switches (RF switches) circuits, voltage regulator circuits, buck converter circuits, power amplifiers, RF LDMOS voltage controllers, single-pole double-throw RF switch for wireless communication systems, or switch mode power supply, etc.

Figure 1:
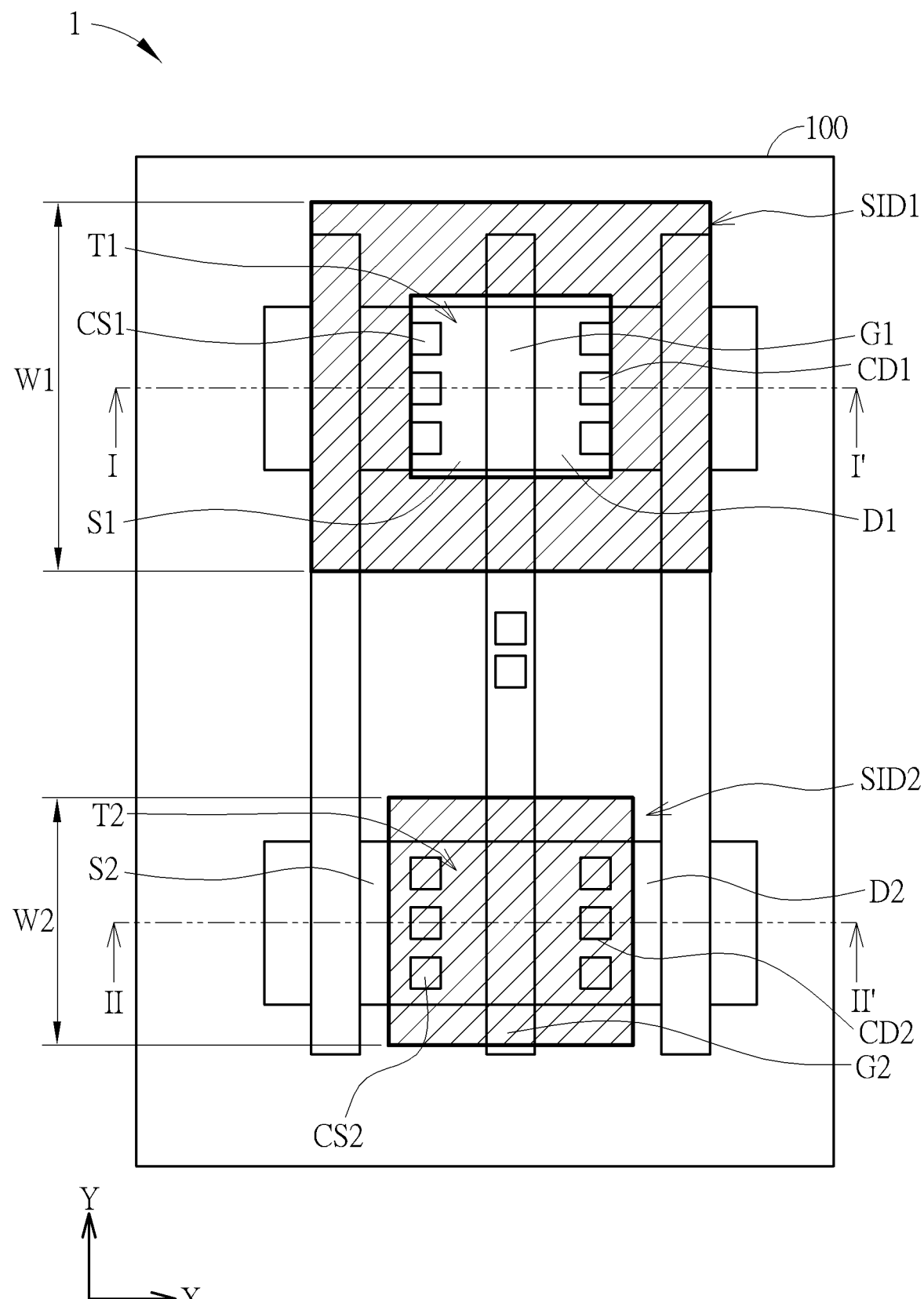
FIG. 1 is a schematic top view of a semiconductor device according to an embodiment of the present invention.
Figure 2:
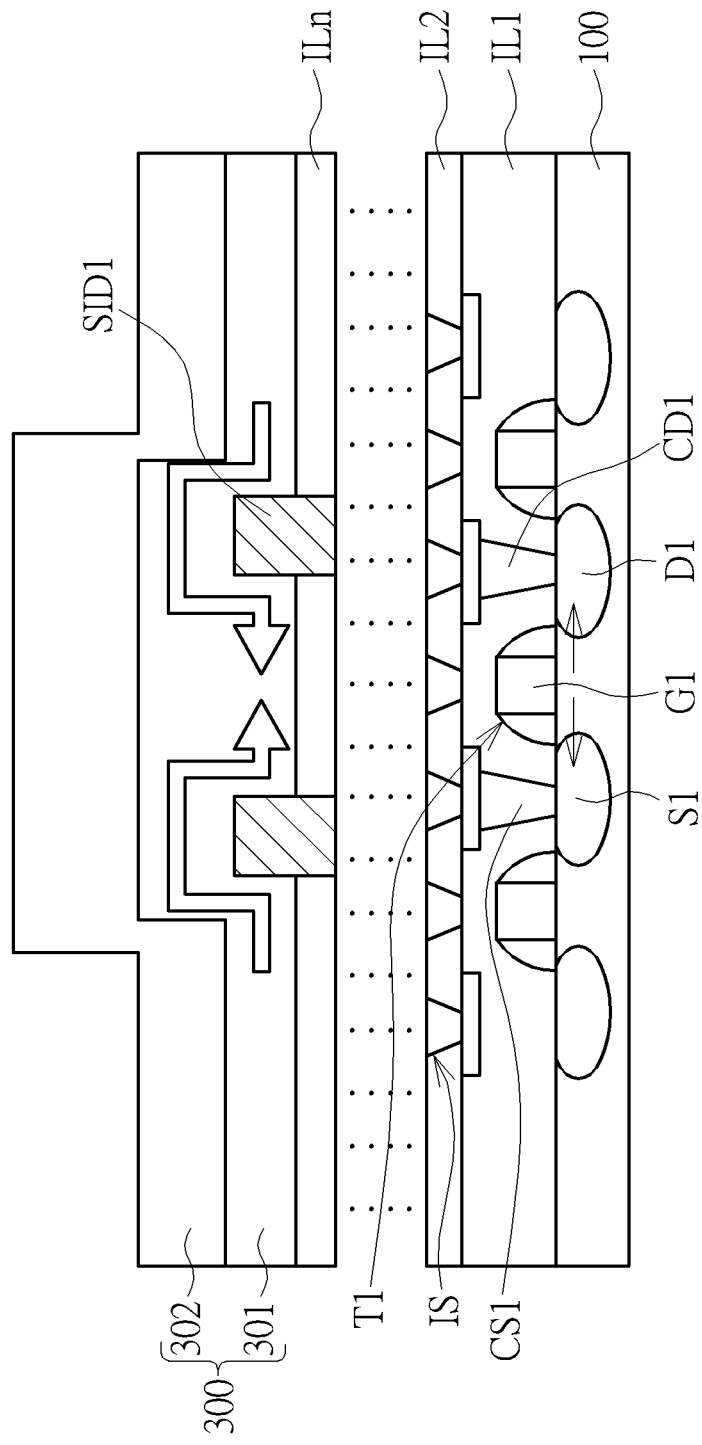
FIG. 2 is a schematic cross-sectional view taken along line I-I' in FIG. 1.
Figure 3:
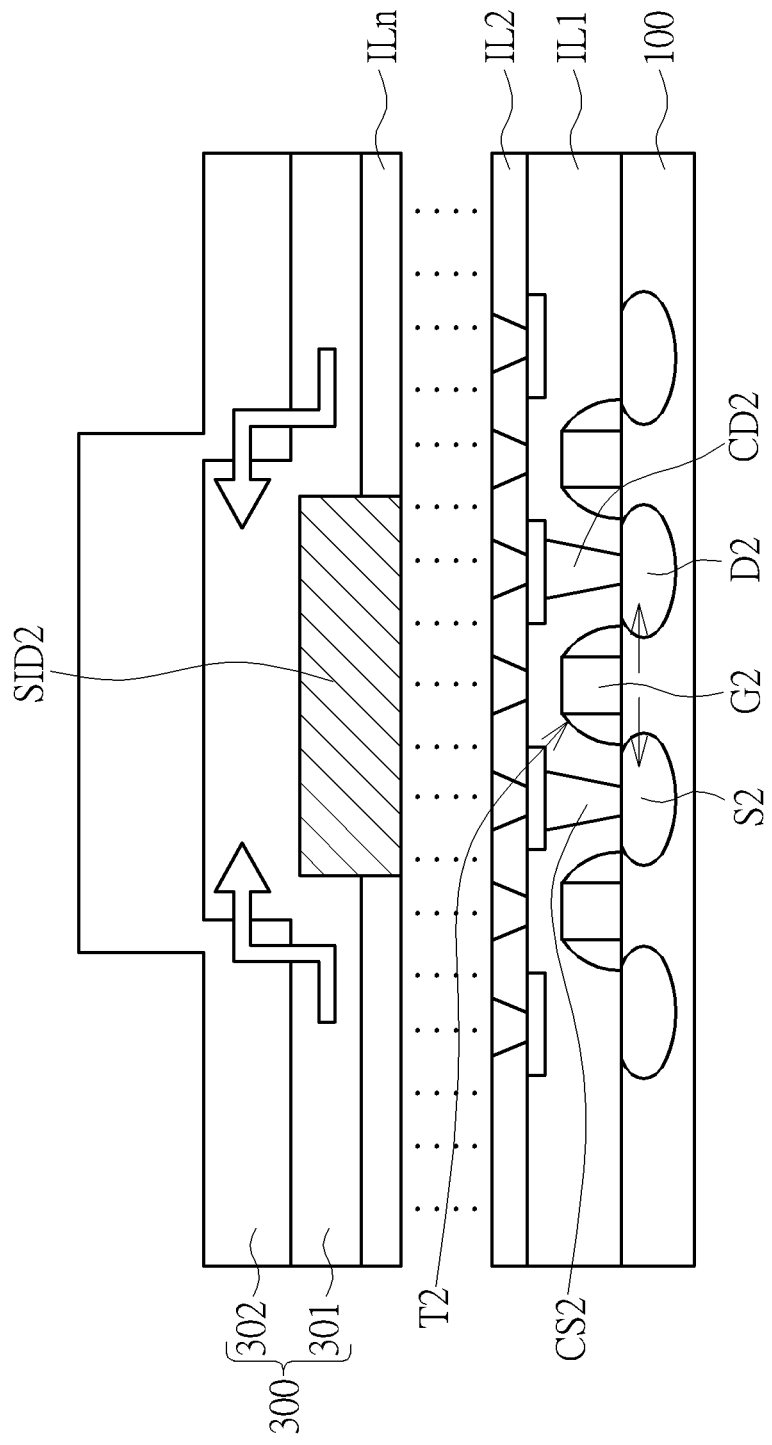
FIG. 3 is a schematic cross-sectional view taken along the line II-II' in FIG. 1.

Please refer to FIG. 1 to FIG. 3. FIG. 1 is a schematic top view of a semiconductor device according to an embodiment of the present invention, FIG. 2 is a schematic cross-sectional view taken along line I-I' in FIG. 1. FIG. 3 is a cross-sectional schematic view taken along line II-II' in FIG. 1. As shown in FIG. 1 to FIG. 3, the semiconductor device 1 includes a substrate 100, such as a silicon substrate, but not limited thereto. On the substrate 100, a first transistor T1 is provided. For example, the first transistor T1 may be an NMOS transistor. A second transistor T2 is provided adjacent to the first transistor T1 on the substrate 100. For example, the second transistor T2 may be a PMOS transistor.

According to an embodiment of the present invention, the first transistor T1 includes a gate G1 extending along the reference Y-axis direction, a source doped region S1, and a drain doped region D1. According to an embodiment of the present invention, the second transistor T2 includes a gate electrode G2 extending along the reference Y-axis direction, a source doped region S2, and a drain doped region D2. According to the embodiment of the present invention, the gate G1 and the gate G2 may be connected.

According to an embodiment of the present invention, at least an interlayer dielectric layer is disposed on the substrate 100, for example, the interlayer dielectric layers IL1, IL2 and ILn in FIG. 2 and FIG. 3, which cover the first transistor T1 and the second transistor T2. According to an embodiment of the present invention, the interlayer dielectric layers IL1, IL2 and ILn may be low-k or ultra-low-k dielectric layers, and the interlayer dielectric layer ILn may be the uppermost interlayer dielectric layer.

According to an embodiment of the present invention, the interlayer dielectric layers IL1, IL2 and ILn are provided with metal interconnect structures IS including, for example, the contact plugs CS1 and CD1 electrically connected to the source doped region S1 and the drain doped region D1 of the first transistor T1, respectively, and the contact plugs CS2 and CD2 electrically connected to of the source doped region S2 and the drain doped region D2 of the second transistor T2, respectively.

According to an embodiment of the present invention, a first stress-inducing dummy metal pattern SID1 may be disposed on the interlayer dielectric layer ILn. According to an embodiment of the present invention, the first stress-inducing dummy metal pattern SID1 is located directly above the first transistor T1. According to an embodiment of the present invention, a second stress-inducing dummy metal pattern SID2 may be further disposed on the interlayer dielectric layer ILn. According to an embodiment of the present invention, the second stress-inducing dummy metal pattern SID2 is located directly above the second transistor T2.

According to an embodiment of the present invention, the first stress-inducing dummy metal pattern SID1 and the second stress-inducing dummy metal pattern SID2 may be disposed in the top metal layer (or the topmost layer metal). According to an embodiment of the present invention, the top metal layer is a copper damascene layer.

According to an embodiment of the present invention, the first stress-inducing dummy metal pattern SID1 and the second stress-inducing dummy metal pattern SID2 may be disposed in a pad layer.

According to an embodiment of the present invention, the pad layer is an aluminum pad layer.

According to an embodiment of the present invention, the first stress-inducing dummy metal pattern SID1 is an annular metal ring pattern, and the second stress-inducing dummy metal pattern SID2 may be a monolithic pad pattern (without holes in the middle), for example, a square pad pattern. According to an embodiment of the present invention, the width W1 of the first stress-inducing dummy metal pattern SID1 in the reference Y-axis direction is greater than or equal to 2 μm, for example, between 5-12 μm, but not limited thereto. According to an embodiment of the present invention, the width W2 of the second stress-inducing dummy metal pattern SID2 in the reference Y-axis direction is greater than or equal to 2 μm, for example, between 5-12 μm, but not limited thereto.

According to an embodiment of the present invention, for example, the size of the first stress-inducing dummy metal pattern SID1 is 9 μm×9 μm, and the size of the central hole thereof is 7 μm×7 μm. For example, the size of the second stress-inducing dummy metal pattern SID2 is 5 μm×5 μm or 7 μm×7 μm, but not limited thereto. According to an embodiment of the present invention, the thicknesses of the first stress-inducing dummy metal pattern SID1 and the second stress-inducing dummy metal pattern SID2 are greater than 0.8 μm, but not limited thereto.

According to an embodiment of the present invention, as shown in FIG. 2 and FIG. 3, the first stress-inducing dummy metal pattern SID1 and the second stress-inducing dummy metal pattern SID2 are covered by the passivation layer 300. According to an embodiment of the present invention, the passivation layer 300 includes, for example, a silicon oxide layer 301 and a stressed silicon nitride layer 302. For example, the thickness of the silicon oxide layer 301 is about 4000 angstroms, and the thickness of the stressed silicon nitride layer 302 is about 5000 angstroms, but not limited thereto. According to an embodiment of the present invention, the stressed silicon nitride layer 302 is a compressive silicon nitride layer with compressive stress.

According to an embodiment of the present invention, the first stress-inducing dummy metal pattern SID1 and the second stress-inducing dummy metal pattern SID2 are electrically floating.

One technical feature of the present invention is that the first stress-inducing dummy metal pattern SID1 can induce tensile stress in both the reference X-axis direction and the reference Y-axis direction to the channel of the first transistor T1 below, while the second stress-inducing dummy metal pattern SID2 can induce compressive stress in the reference X-axis direction to the channel of the second transistor T2 below, thereby enhancing operation performance of the second transistor T2.

Figure 4:
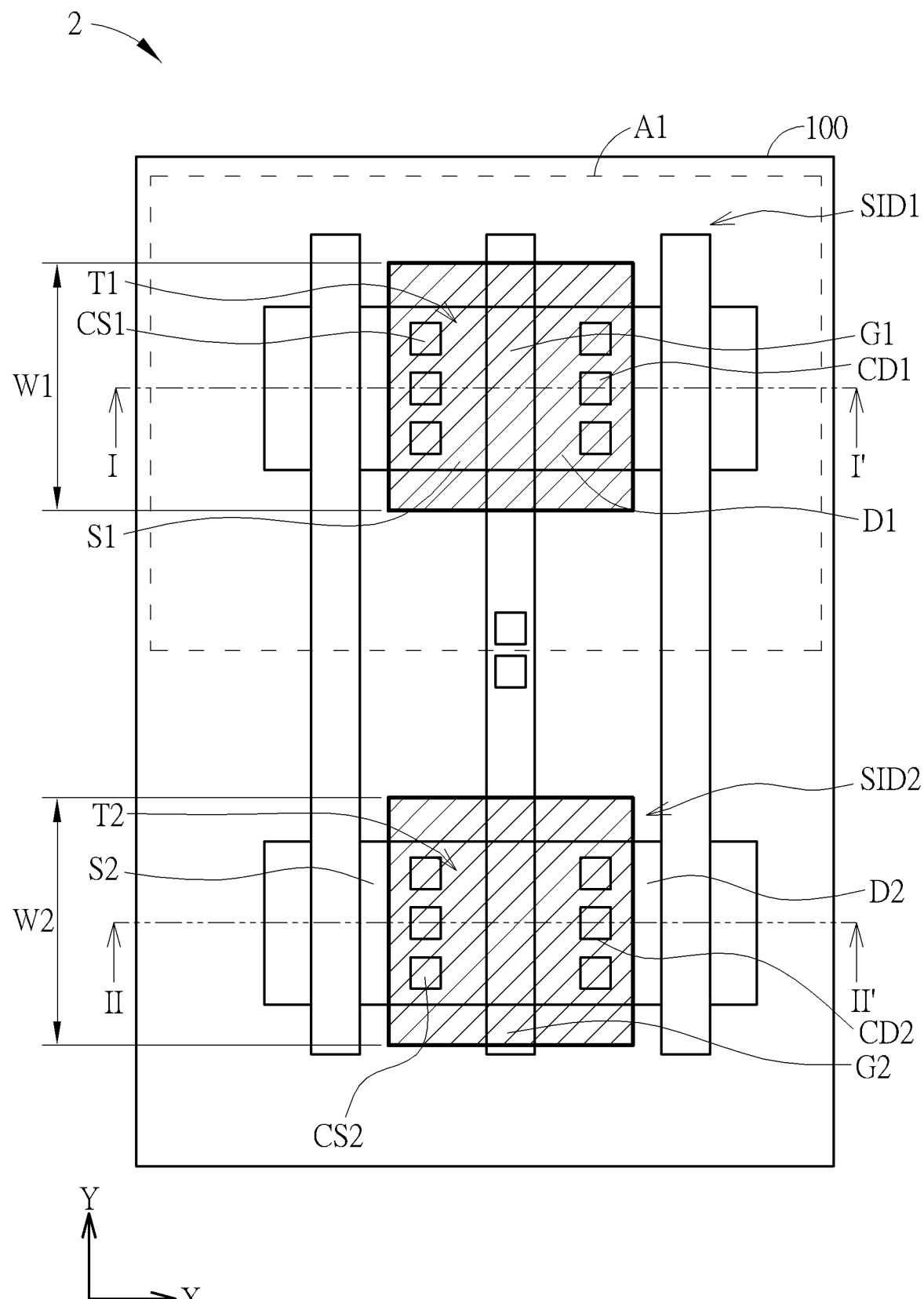
FIG. 4 is a schematic top view of a semiconductor device according to another embodiment of the present invention.
Figure 5:
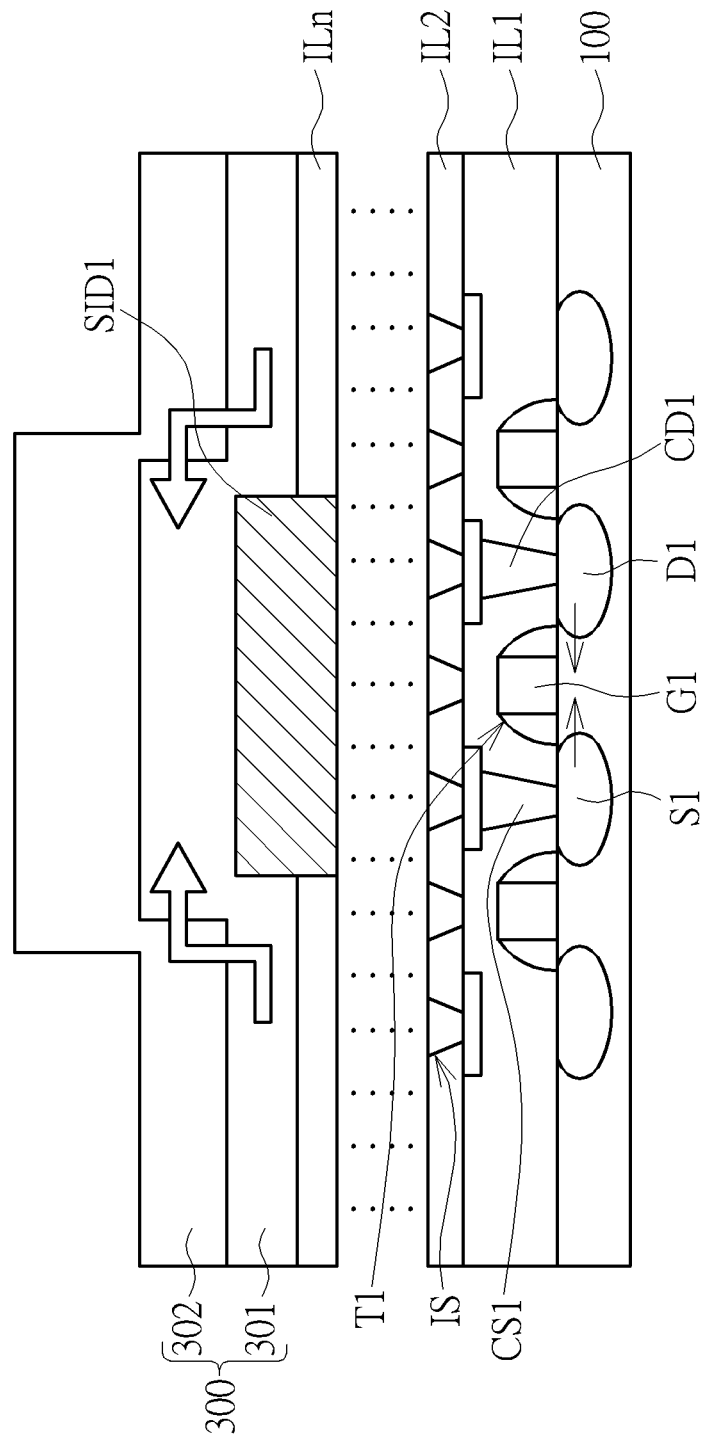
FIG. 5 is a schematic cross-sectional view taken along line I-I' in FIG. 4.
Figure 6:
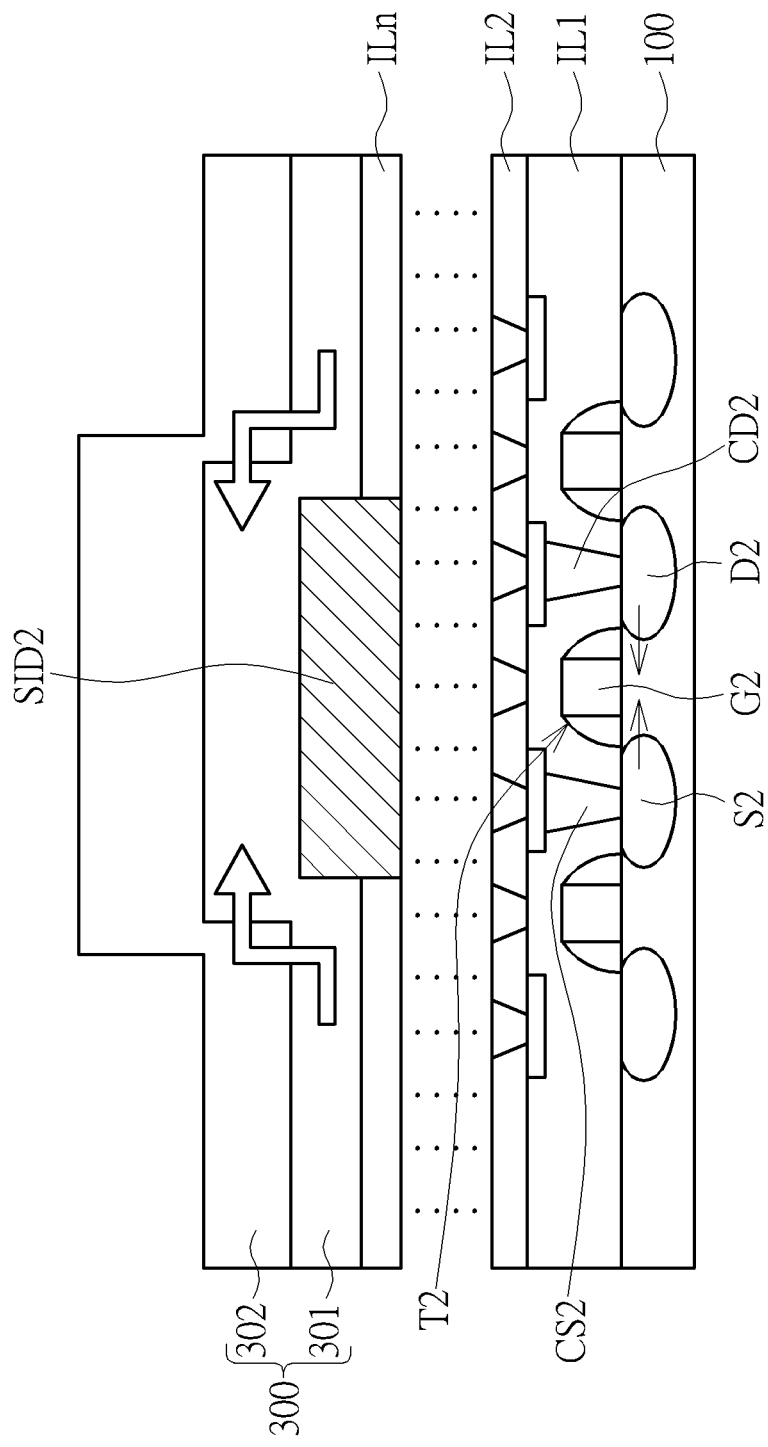
FIG. 6 is a schematic cross-sectional view taken along line II-II' in FIG. 4.

Please refer to FIG. 4 to FIG. 6. FIG. 4 is a schematic top view of a semiconductor device according to another embodiment of the present invention, FIG. 5 is a schematic cross-sectional view taken along line I-I' in FIG. 4, and FIG. 6 is a schematic cross-sectional view taken along line II-II' in FIG. 4, wherein like regions, layers or elements are designated by like numeral numbers or labels.

As shown in FIG. 4 to FIG. 6, likewise, the semiconductor device 2 includes a substrate 100, such as a silicon substrate, but not limited thereto. On the substrate 100, a first transistor T1 is provided. For example, the first transistor T1 may be an NMOS transistor. A second transistor T2 is provided adjacent to the first transistor T1 on the substrate 100. For example, the second transistor T2 may be a PMOS transistor.

According to an embodiment of the present invention, the first transistor T1 includes a gate G1 extending along the reference Y-axis direction, a source doped region S1, and a drain doped region D1. According to an embodiment of the present invention, the second transistor T2 includes a gate G2 extending along the reference Y-axis direction, a source doped region S2, and a drain doped region D2. According to an embodiment of the present invention, the gate G1 and the gate G2 may be connected.

According to an embodiment of the present invention, at least one interlayer dielectric layer is disposed on the substrate 100, for example, the interlayer dielectric layers IL1, IL2 and ILn in FIG. 5 and FIG. 6, covering the first transistor T1 and the second transistor T2. According to an embodiment of the present invention, the interlayer dielectric layers IL1, IL2 and ILn may be low-k or ultra-low-k dielectric layers, and the interlayer dielectric layer ILn may be the uppermost interlayer dielectric layer.

According to an embodiment of the present invention, the interlayer dielectric layers IL1, IL2 and ILn are provided with metal interconnect structures IS including, for example, the contact plugs CS1 and CD1 electrically connected to the source doped region S1 and the drain doped region D1 of the first transistor T1, respectively, and the contact plugs CS2 and CD2 electrically connected to of the source doped region S2 and the drain doped region D2 of the second transistor T2, respectively.

According to an embodiment of the present invention, a first stress-inducing dummy metal pattern SID1 may be disposed on the interlayer dielectric layer ILn. According to an embodiment of the present invention, the first stress-inducing dummy metal pattern SID1 is located directly above the first transistor T1. According to an embodiment of the present invention, a second stress-inducing dummy metal pattern SID2 may be further disposed on the interlayer dielectric layer ILn. According to an embodiment of the present invention, the second stress-inducing dummy metal pattern SID2 is located directly above the second transistor T2.

According to an embodiment of the present invention, the first stress-inducing dummy metal pattern SID1 and the second stress-inducing dummy metal pattern SID2 may be disposed in the top metal layer (or the topmost layer metal). According to an embodiment of the present invention, the top metal layer is a copper damascene layer.

According to an embodiment of the present invention, the first stress-inducing dummy metal pattern SID1 and the second stress-inducing dummy metal pattern SID2 may be disposed in a pad layer.

According to an embodiment of the present invention, the pad layer is an aluminum pad layer.

According to an embodiment of the present invention, the first stress-inducing dummy metal pattern SID1 and the second stress-inducing dummy metal pattern SID2 are monolithic pad patterns, for example, monolithic square patterns. According to an embodiment of the present invention, the width W1 of the first stress-inducing dummy metal pattern SID1 in the reference Y-axis direction is greater than or equal to 2 μm, for example, between 5-12 μm, but not limited thereto. According to an embodiment of the present invention, the width W2 of the second stress-inducing dummy metal pattern SID2 in the reference Y-axis direction is greater than or equal to 2 μm, for example, between 5-12 μm, but not limited thereto.

According to an embodiment of the present invention, for example, the sizes of the first stress-inducing dummy metal pattern SID1 and the second stress-inducing dummy metal pattern SID2 are both 5 μm×5 μm or 7 μm×7 μm, but not limited thereto. According to an embodiment of the present invention, the thicknesses of the first stress-inducing dummy metal pattern SID1 and the second stress-inducing dummy metal pattern SID2 are greater than 0.8 μm, but not limited thereto.

According to an embodiment of the present invention, as shown in FIG. 5 and FIG. 6, the first stress-inducing dummy metal pattern SID1 and the second stress-inducing dummy metal pattern SID2 are covered by the passivation layer 300. According to an embodiment of the present invention, the passivation layer 300 includes, for example, a silicon oxide layer 301 and a stressed silicon nitride layer 302. For example, the thickness of the silicon oxide layer 301 is about 4000 angstroms, and the thickness of the stressed silicon nitride layer 302 is about 5000 angstroms, but not limited thereto. According to an embodiment of the present invention, the stressed silicon nitride layer 302 has tensile stress in the area A1 over the first transistor T1, and has compressive stress above the second transistor T2.

According to an embodiment of the present invention, the first stress-inducing dummy metal pattern SID1 and the second stress-inducing dummy metal pattern SID2 are electrically floating.

Figure 7:
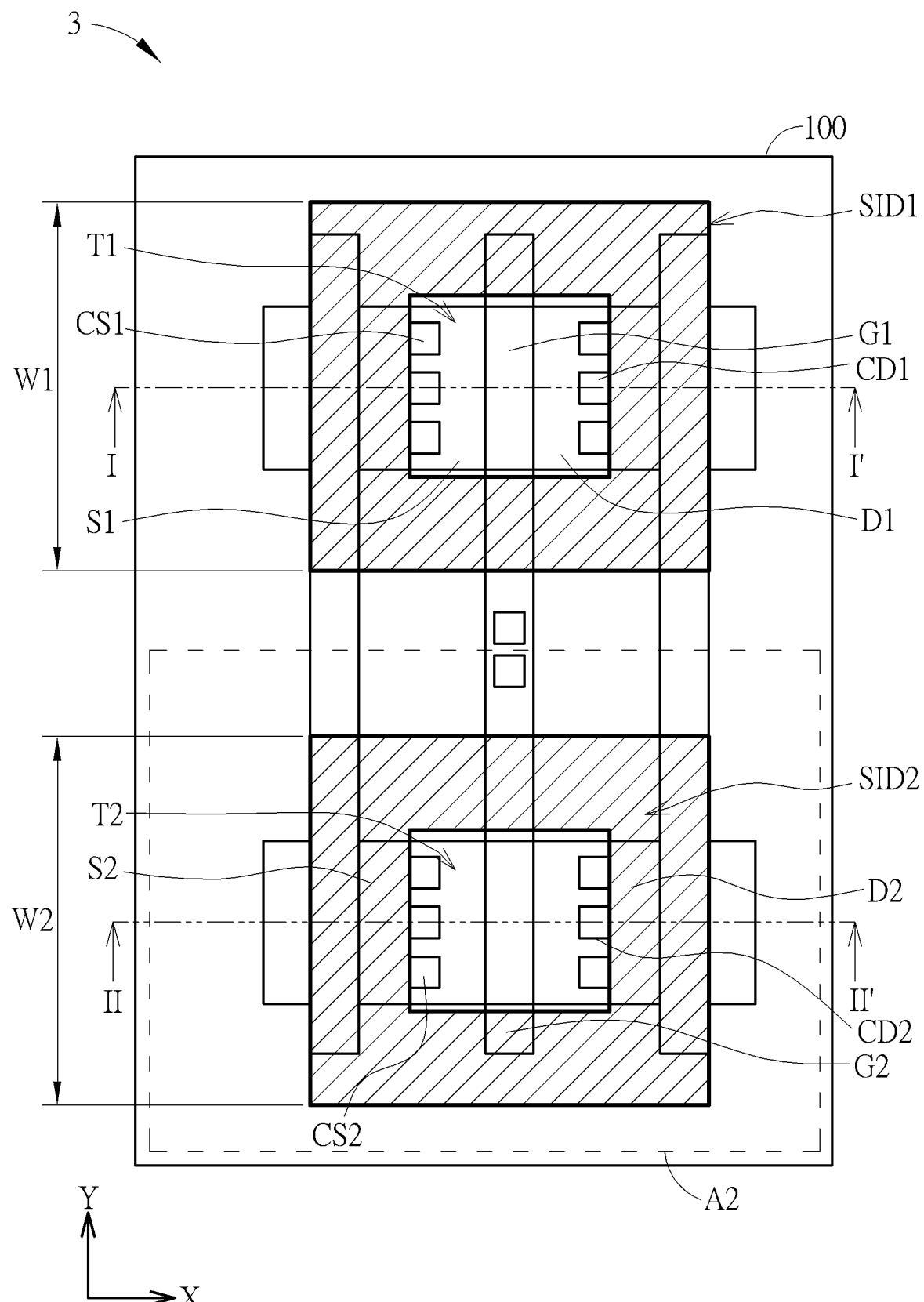
FIG. 7 is a schematic top view of a semiconductor device according to still another embodiment of the present invention.
Figure 8:
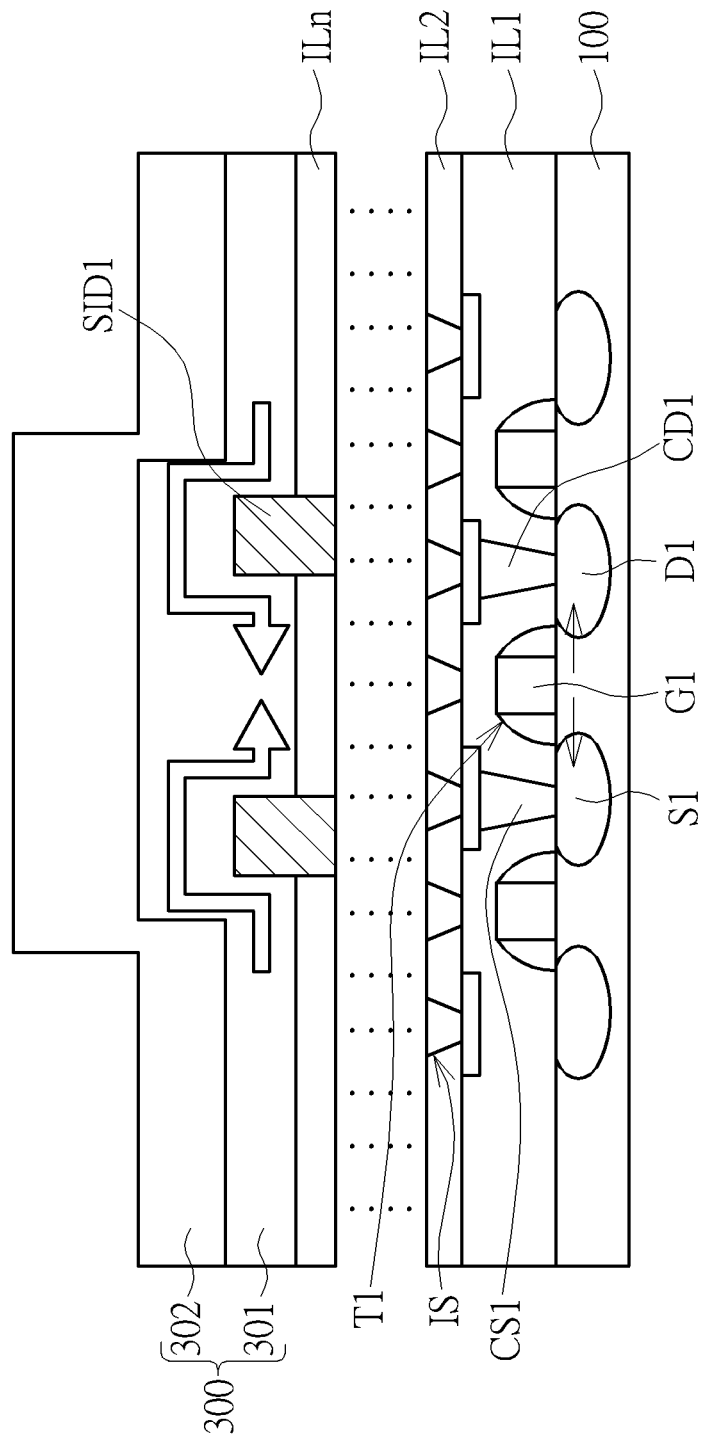
FIG. 8 is a schematic cross-sectional view taken along line I-I' in FIG. 7.
Figure 9:
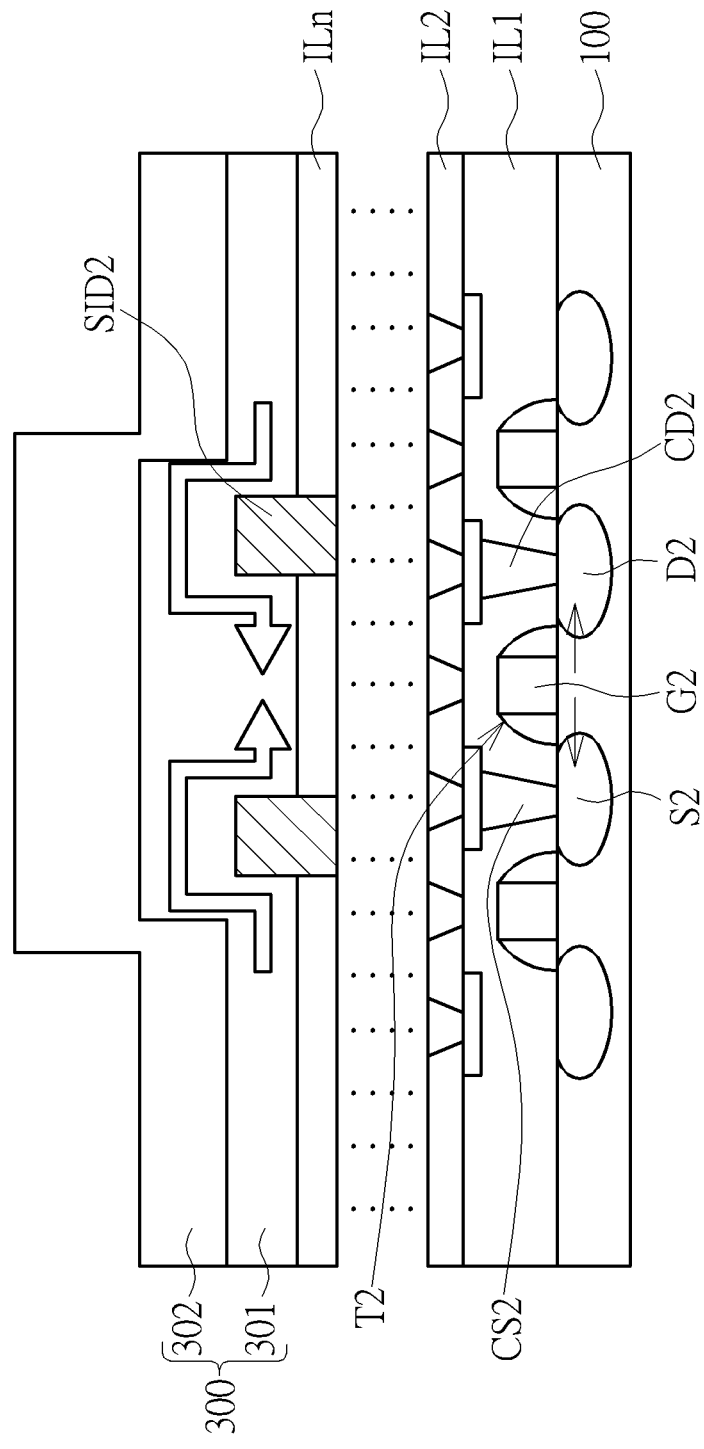
FIG. 9 is a schematic cross-sectional view taken along line II-II' in FIG. 7.

Please refer to FIG. 7 to FIG. 9. FIG. 7 is a schematic top view of a semiconductor device according to still another embodiment of the present invention, FIG. 8 is a schematic cross-sectional view taken along line I-I' in FIG. 7, and FIG. 9 is a schematic cross-sectional view taken along line II-II' in FIG. 7, wherein like regions, layers or elements are designated by like numeral numbers or labels.

As shown in FIG. 7 to FIG. 9, likewise, the semiconductor device 3 includes a substrate 100, such as a silicon substrate, but not limited thereto. On the substrate 100, a first transistor T1 is provided. For example, the first transistor T1 may be an NMOS transistor. A second transistor T2 is provided adjacent to the first transistor T1 on the substrate 100. For example, the second transistor T2 may be a PMOS transistor.

According to an embodiment of the present invention, the first transistor T1 includes a gate G1 extending along the reference Y-axis direction, a source doped region S1, and a drain doped region D1. According to an embodiment of the present invention, the second transistor T2 includes a gate G2 extending along the reference Y-axis direction, a source doped region S2, and a drain doped region D2. According to the embodiment of the present invention, the gate G1 and the gate G2 may be connected.

According to an embodiment of the present invention, at least an interlayer dielectric layer is disposed on the substrate 100, for example, the interlayer dielectric layers IL1, IL2 and ILn in FIG. 8 and FIG. 9, covering the first transistor T1 and the second transistor T2. According to an embodiment of the present invention, the interlayer dielectric layers IL1, IL2 and ILn may be low-k or ultra-low-k dielectric layers. The interlayer dielectric layer ILn may be the uppermost interlayer dielectric layer.

According to an embodiment of the present invention, the interlayer dielectric layers IL1, IL2 and ILn are provided with metal interconnect structures IS including, for example, the contact plugs CS1 and CD1 electrically connected to the source doped region S1 and the drain doped region D1 of the first transistor T1, respectively, and the contact plugs CS2 and CD2 electrically connected to of the source doped region S2 and the drain doped region D2 of the second transistor T2, respectively.

According to an embodiment of the present invention, the first stress-inducing dummy metal pattern SID1 may be disposed on the interlayer dielectric layer ILn. According to an embodiment of the present invention, the first stress-inducing dummy metal pattern SID1 is located directly above the first transistor T1. According to an embodiment of the present invention, a second stress-inducing dummy metal pattern SID2 may be further disposed on the interlayer dielectric layer ILn. According to an embodiment of the present invention, the second stress-inducing dummy metal pattern SID2 is located directly above the second transistor T2.

According to an embodiment of the present invention, the first stress-inducing dummy metal pattern SID1 and the second stress-inducing dummy metal pattern SID2 may be disposed in the top metal layer (or the topmost layer metal). According to an embodiment of the present invention, the top metal layer is a copper damascene layer.

According to an embodiment of the present invention, the first stress-inducing dummy metal pattern SID1 and the second stress-inducing dummy metal pattern SID2 may be disposed in a pad layer.

According to an embodiment of the present invention, the pad layer is an aluminum pad layer.

According to an embodiment of the present invention, both the first stress-inducing dummy metal pattern SID1 and the second stress-inducing dummy metal pattern SID2 are annular metal ring patterns. According to an embodiment of the present invention, the width W1 of the first stress-inducing dummy metal pattern SID1 in the reference Y-axis direction is greater than or equal to 2 μm, for example, between 5-12 μm, but not limited thereto. According to an embodiment of the present invention, the width W2 of the second stress-inducing dummy metal pattern SID2 in the reference Y-axis direction is greater than or equal to 2 μm, for example, between 5-12 μm, but not limited thereto.

According to an embodiment of the present invention, for example, the sizes of the first stress-inducing dummy metal pattern SID1 and the second stress-inducing dummy metal pattern SID2 are both 7 μm×7 μm or 9 μm×9 μm, but not limited thereto. According to an embodiment of the present invention, the thicknesses of the first stress-inducing dummy metal pattern SID1 and the second stress-inducing dummy metal pattern SID2 are greater than 0.8 μm, but not limited thereto.

According to an embodiment of the present invention, as shown in FIG. 8 and FIG. 9, the first stress-inducing dummy metal pattern SID1 and the second stress-inducing dummy metal pattern SID2 are covered by the passivation layer 300. According to an embodiment of the present invention, the passivation layer 300 includes, for example, a silicon oxide layer 301 and a stressed silicon nitride layer 302. For example, the thickness of the silicon oxide layer 301 is about 4000 angstroms, and the thickness of the stressed silicon nitride layer 302 is about 5000 angstroms, but not limited thereto. According to an embodiment of the present invention, the stressed silicon nitride layer 302 has tensile stress in the area A2 over the second transistor T2, and has compressive stress above the first transistor T1.

According to an embodiment of the present invention, the first stress-inducing dummy metal pattern SID1 and the second stress-inducing dummy metal pattern SID2 are electrically floating.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate;
a first transistor disposed on the substrate;
a second transistor disposed in proximity to the first transistor on the substrate;
at least one interlayer dielectric layer covering the first transistor and the second transistor;
a first stress-inducing dummy metal pattern disposed on the at least one interlayer dielectric layer and directly above the first transistor, wherein the first stress-inducing dummy metal pattern induces tensile stress to a channel of the first transistor; and
a second stress-inducing dummy metal pattern disposed on the at least one interlayer dielectric layer and directly above the second transistor, wherein the second stress-inducing dummy metal pattern induces compressive stress to a channel of the second transistor, wherein the first stress-inducing dummy metal pattern and the second stress-inducing dummy metal pattern are disposed in a top metal layer or a pad layer disposed on an uppermost interlayer dielectric layer that is in direct contact with a passivation layer.

2. The semiconductor device according to claim 1, wherein the top metal layer is a copper damascene layer.

3. The semiconductor device according to claim 1, wherein the pad layer is an aluminum pad layer.

4. The semiconductor device according to claim 1, wherein the first stress-inducing dummy metal pattern is an annular metal ring pattern and the second stress-inducing dummy metal pattern is a monolithic pad pattern.

5. The semiconductor device according to claim 1, wherein the first stress-inducing dummy metal pattern and the second stress-inducing dummy metal pattern are monolithic pad patterns.

6. The semiconductor device according to claim 1, wherein the first stress-inducing dummy metal pattern and the second stress-inducing dummy metal pattern are annular metal ring patterns.

7. The semiconductor device according to claim 1, wherein the first stress-inducing dummy metal pattern and the second stress-inducing dummy metal pattern are covered with the passivation layer.

8. The semiconductor device according to claim 7, wherein the passivation layer comprises a silicon oxide layer and a stressed silicon nitride layer.

9. The semiconductor device according to claim 8, wherein the stressed silicon nitride layer is a compressive silicon nitride layer.

10. The semiconductor device according to claim 8, wherein the first transistor is an NMOS transistor and the stressed silicon nitride layer has tensile stress over the first transistor, and wherein the second transistor is a PMOS transistor and the stressed silicon nitride layer has compressive stress over the second transistor.

11. The semiconductor device according to claim 8, wherein the first transistor is an NMOS transistor and the stressed silicon nitride layer has compressive stress over the first transistor, and wherein the second transistor is a PMOS transistor and the stressed silicon nitride layer has tensile stress over the second transistor.

12. The semiconductor device according to claim 1, wherein the first stress-inducing dummy metal pattern and the second stress-inducing dummy metal pattern are electrically floating.

13. The semiconductor device according to claim 1, wherein the first stress-inducing dummy metal pattern and the second stress-inducing dummy metal pattern have a width greater than or equal to 2 micrometers along an extending direction of a gate underlying the first stress-inducing dummy metal pattern and the second stress-inducing dummy metal pattern.

14. The semiconductor device according to claim 1, wherein the first stress-inducing dummy metal pattern and the second stress-inducing dummy metal pattern have a thickness greater than 0.8 micrometers.

* * * * *